(12) United States Patent
Gupta

(10) Patent No.: US 7,239,176 B2
(45) Date of Patent: Jul. 3, 2007

(54) VOLTAGE TOLERANT PROTECTION CIRCUIT FOR INPUT BUFFER

(75) Inventor: Nitin Gupta, Noida (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 99 days.

(21) Appl. No.: 11/143,094

(22) Filed: Jun. 2, 2005

(65) Prior Publication Data

US 2006/0087340 A1    Apr. 27, 2006

(30) Foreign Application Priority Data

Oct. 21, 2004   (IN)   .................. 1009/DEL/2004

(51) Int. Cl.
*H03K 19/094* (2006.01)
(52) U.S. Cl. .............................. 326/68; 326/80; 326/81
(58) Field of Classification Search ............ 326/80–83, 326/113, 68; 327/108–112
See application file for complete search history.

(56) References Cited

U.S. PATENT DOCUMENTS 6,768,339 B2 *  7/2004  Von Thun et al. ............ 326/81

2004/0141392 A1 *  7/2004  Lee et al. .................... 365/200

* cited by examiner

Primary Examiner—Anh Q. Tran
(74) Attorney, Agent, or Firm—Lisa K. Jorgenson; Jon A. Gibbons; Fleit Kain Gibbons Gutman Bongini & Bianco P.L.

(57) ABSTRACT

An improved voltage tolerant protection circuit for input buffer comprising a transmission gate circuit receiving input from the pad for passing the input signal to the input of the input buffer, a control signal generator electrically coupled between the transmission gate circuit and the pad to provide a control signal for operating the transmission gate circuit, and an N-Well generation circuit electrically coupled between the pad and the transmission gate circuit, and also electrically coupled to the control signal generator for generating a bias signal for the transmission gate circuit and the control signal generator. Thus, the present invention provides a voltage tolerant protection circuit that prevents electrical stress on transistors, minimizes power supply consumption and transfers signals without any change in amplitude.

15 Claims, 6 Drawing Sheets

Transmission Gate

PMOSCTRL signal Generation

Control Signal Generator

Block Diagram

Transmission Gate

PMOSCTRL signal Generation

Control Signal Generator

Floating NWELL Generation

US 7,239,176 B2

VOLTAGE TOLERANT PROTECTION CIRCUIT FOR INPUT BUFFER

CROSS-REFERENCE TO RELATED APPLICATIONS

This application is based upon and claims priority from prior Indian Patent Application No. 1009/Del/2004, filed on Oct. 21, 2004, which is based on and claims priority on Indian Provisional Patent Application No. 1009/Del/2004, filed on Jun. 2, 2004, the entire disclosure of each the two-above referenced applications is hereby incorporated by reference in their entirety.

FIELD OF THE INVENTION

The present invention generally relates to a voltage tolerant input protection circuit, and more particularly to a voltage tolerant protection circuit for input buffer.

BACKGROUND OF THE INVENTION

The significance of voltage protection circuit for input buffer is discussed with reference to a differential receiver circuit. Herein, the voltage protection circuit is a circuit between the I/O pad of an integrated circuit and a differential receiver, the protection circuit producing a signal that is used as an attenuation free input signal for the differential receiver circuit. For a differential receiver operating on 3.3V technology having common mode input range equal to 0.8V to 2.5V and having differential input sensitivity equal to 200 mV, it is essential that both the inputs of the differential receiver are free of any amplitude attenuation in common mode input range. To make the differential receiver five-volt tolerant, the input voltage must be equal to the supply voltage. Stated differently, the input voltage must exceed and cross the supply voltage.

Conventionally, NMOS transistors are used in voltage tolerant protection circuits, wherein the gate of the NMOS transistor is connected to the supply voltage. The source is connected to the Pad and the drain is connected to the Input Buffer. If the voltage at Pad is less than or equal to VDD−Vt (NMOS Threshold), the signal at the input buffer follows the Pad voltage without any amplitude attenuation. When Pad voltage is higher than the NMOS threshold then the signal at the input buffer is attenuated at NMOS threshold. For minimum allowed supply voltage, the signal at the input buffer goes beyond NMOS threshold and for large common mode input range the value of NMOS threshold may lie between the common mode input range, thus resulting in signal degradation. Further, delay is introduced on the rising edge of the signal at the input buffer for high frequency operation of the input buffer.

FIG. 1 illustrates a prior art voltage protection circuit as per US Patent Application Publication No. 2004/0007712 A1, which is hereby incorporated by reference in its entirety. Here, NMOS transistors are used for protection. As per the given circuit, VOUT follows the Pad voltage from 0V to VDD−vt (PMOS threshold), and supply voltage (VDD) is outputted at VOUT whenever input voltage crosses the PMOS threshold. There is static consumption on the supply voltage through transistors 224 & 226 when Pad voltage is less than VDD−vt (PMOS threshold) and it is undesirable to have a direct path between power supply and ground in normal operating condition. When Pad voltage is greater than VDD−vt (PMOS threshold), and 3.3V transistors are used in the protection circuit, there can be electrical stress on PMOS 234. Electrical stress on the transistors in the protection circuit is undesirable and often results in the output signal attenuation.

Accordingly what is needed is a method and system to overcome the problems encountered in the prior art voltage protection circuits and to provide a voltage tolerant protection circuit for an input buffer that prevents stress on transistors, minimizes power supply consumption and transfers signals without any change in the amplitude.

SUMMARY OF THE INVENTION

The present invention provides an improved voltage tolerant protection circuit for input buffer. The protection circuit according to the present invention consumes little or zero power on pad in normal operating conditions, and minimum power consumption when pad is operating at a higher voltage. Further, the protection circuit provides an attenuation free signal up to the supply voltage for the input buffer and mitigates stress on the transistors in the protection circuit.

The present invention provides an improved voltage tolerant protection circuit for input buffer comprising a transmission gate circuit receiving input from the pad. A control signal generator connected between the transmission gate circuit and the input pad provides a control signal for operating the transmission gate circuit. An N-Well generation circuit connected between the pad and the transmission gate circuit, and also connected to the control signal generator generates a bias signal for the transmission gate circuit and the control signal generator.

The transmission gate circuit comprises a first transistor receiving the control signal from the control signal generator and the bias signal from the N-Well generation circuit to transfer pad voltage from threshold voltage to a supply voltage. A second transistor is connected to the first transistor. The second transistor receives a supply voltage and a ground, as control signals to form a closed path in response to the pad voltage being higher than the supply voltage. A third transistor is connected to the first and second transistors for providing an output equal to supply voltage when the pad voltage crosses the supply voltage. The first transistor is a PMOS transistor and the second and third transistors are NMOS transistors.

The control signal generator comprises a first PMOS transistor connected to pad. The first PMOS transistor receives control signals from the supply voltage and the N-Well generation block for avoiding power consumption on the input pad. A second NMOS transistor is connected to the first PMOS transistor. The second NMOS transistor receives control signals from the supply voltage and the ground for transferring a voltage potential in response to the pad voltage being less than the supply voltage.

A third NMOS transistor is connected to the second NMOS transistor. The third NMOS transistor receives control signals for transferring a voltage potential to the source of the second NMOS transistor in response to the pad voltage being less than or equal to PMOS threshold and to form an open circuit path when pad voltage is greater than the PMOS threshold.

A fourth PMOS transistor is connected to the input pad. The fourth PMOS transistor receives the bias signal and supply voltage for providing a closed path for conduction when pad voltage is greater than the PMOS threshold.

A fifth NMOS transistor is connected to the fourth PMOS transistor. The fifth PMOS transistor receives control signals from the supply voltage and the ground to provide controlled voltage response when the pad voltage is greater than the supply voltage.

A sixth NMOS transistor is connected to the fifth NMOS transistor. The sixth NMOS transistor provides a controlled potential at the source of the fifth NMOS transistor.

A seventh NMOS transistor is connected to the sixth NMOS transistor. The seventh NMOS transistor provides a controlled closed circuit path.

An eighth NMOS transistor and a ninth NMOS transistor are connected to the sixth NMOS transistor for outputting a NMOS threshold potential in response to the pad voltage being less than or equal to the supply voltage.

A tenth PMOS transistor and an eleventh NMOS transistor are connected to the sixth and seventh NMOS transistors and to the eighth NMOS transistor. The tenth PMOS transistor and eleventh NMOS transistor both provides a true value (i.e. without change in amplitude) of the supply voltage to the third NMOS transistor.

The sixth and seventh NMOS transistors are connected in series.

The drain terminals of the eighth and ninth NMOS transistors are connected to their respective gate terminals, and source of the eighth NMOS transistor is connected to drain of the ninth NMOS transistor.

The tenth PMOS transistor and the eleventh NMOS transistor are connected to each other to form an inverter circuit.

The present invention also provides a method for protecting an input buffer circuit comprising:

transferring a signal from a input pad to the input buffer through a transmission gate circuit;

providing a control signal to the transmission gate circuit by a control signal generator, the control signal being zero volt in response to a voltage on the input pad being less than or equal to supply voltage, and being of same value as the voltage on input pad when the voltage on the voltage on the input pad is higher than the supply voltage, thereby avoiding electrical stress on the transistors; and providing a bias signal for the control signal generator and the transmission gate circuit, the bias signal being equal to supply voltage when the voltage on the pad input is less than the supply voltage and equal to threshold potential in response to the voltage on the pad voltage being greater than supply voltage.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
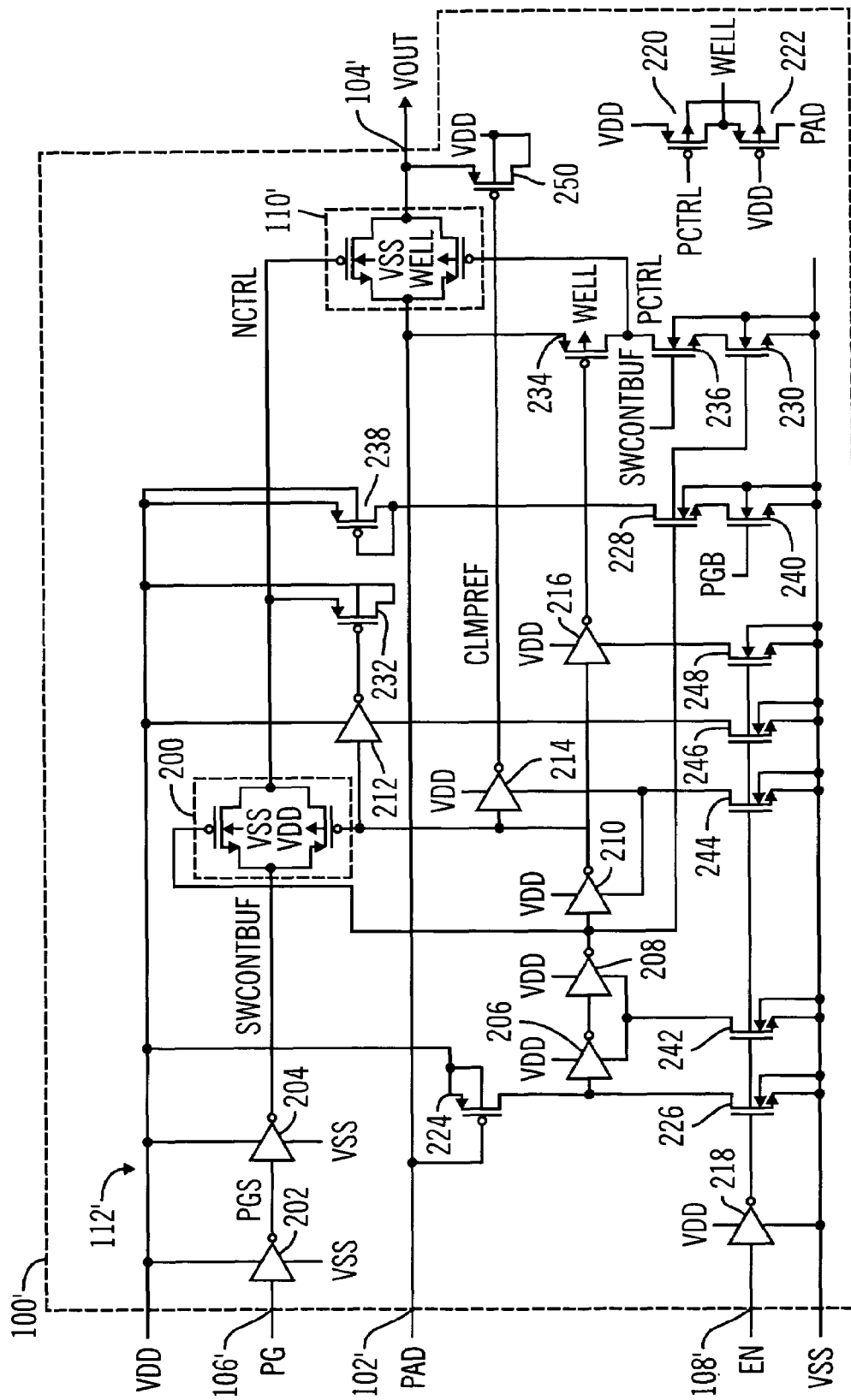
FIG. 1 is a prior art voltage protection circuit diagram.
Figure 2:
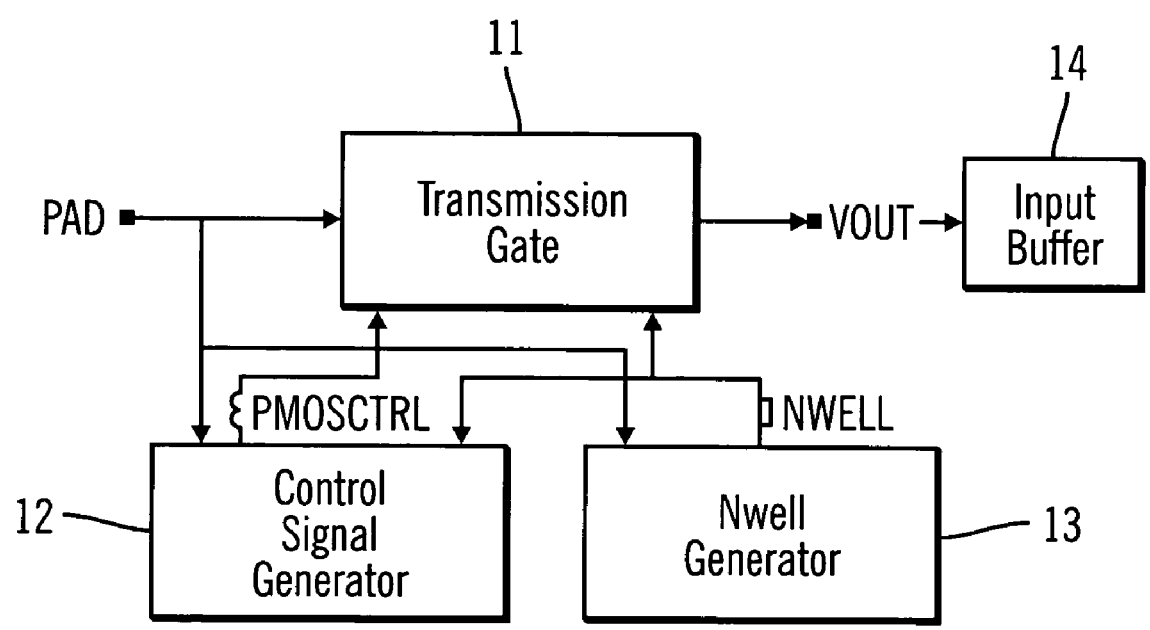
FIG. 2 is the block diagram of a voltage protection circuit for an input buffer in accordance with an embodiment of the present invention.

FIG. 2 shows the block diagram of the improved voltage tolerant protection circuit for input buffer, which comprises a Transmission gate (11), for transferring signal from PAD to the Input Buffer (14). A Control Signal Generator (12), to generate control signal PMOSCTRL for the Transmission gate (11), so as to enable the Transmission gate (11) to transfer the voltage from PAD to the Input buffer (14). An NWELL Generator (13) to provide bias voltage to the Transmission gate (11) and the Control Signal Generator (12), for minimizing power dissipation.

Figure 3:
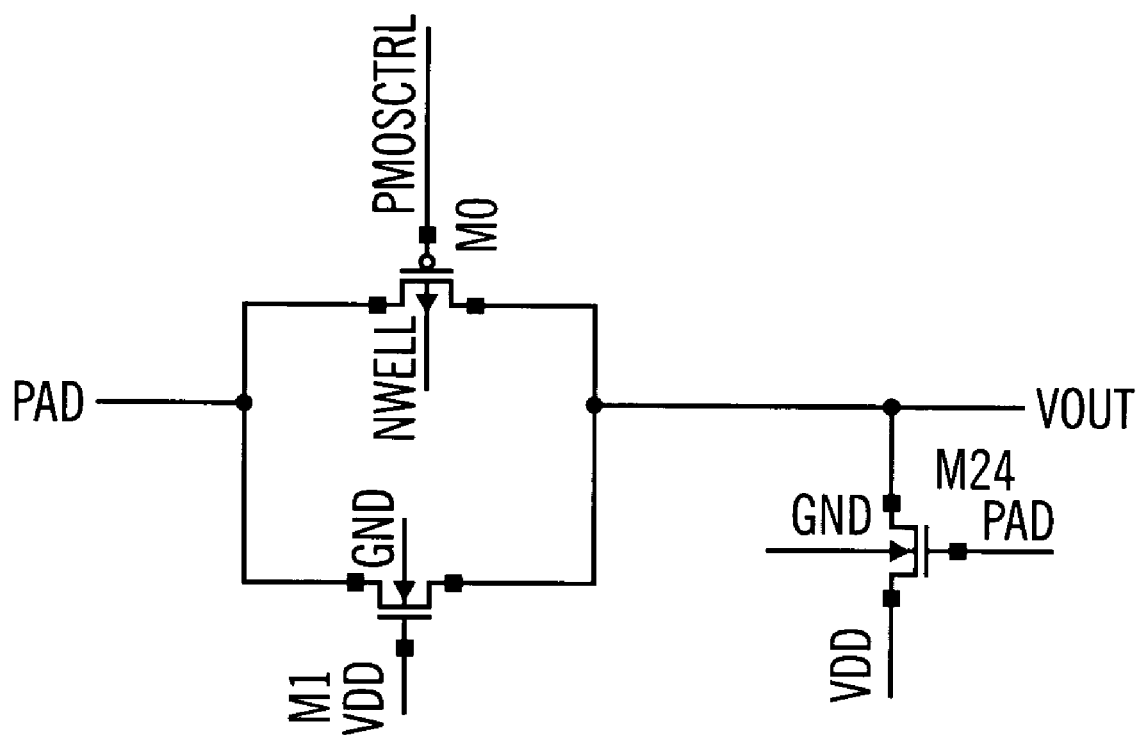
FIG. 3 is the circuit diagram of transmission gate of the voltage protection circuit of FIG. 2, in accordance with an embodiment of the present invention.

FIG. 3 defines the circuit diagram of the Transmission Gate (11). Here, PAD is the input signal and VOUT is the output signal of the transmission gate. VOUT is the input signal for the Input buffer. The Transmission gate circuit is required to operate for the following input/output parameters.

i. When Pad voltage$\leq$VDD, VOUT=Pad voltage ii. When Pad voltage>VDD, VOUT$\leq$VDD For obtaining the above stated output parameters, the drain of NMOS M1 is connected to PAD, source is connected to VOUT and gate is connected to the Supply voltage (VDD). As a result of this connection, the voltage VOUT follows the PAD voltage up to the NMOS threshold (VDD−Vtn).

PMOS M0 is required to transfer the Pad voltage from NMOS threshold to the supply voltage. To achieve this, the source terminal of transistor M0 is connected to the Pad, drain terminal is connected to VOUT, and gate of M0 receives the signal PMOSCTRL from the Control Signal Generator. When the Pad voltage is less than or equal to the supply voltage, the value of PMOSCTRL signal is zero volt and true Pad voltage is transferred to VOUT, through NMOS M1 and PMOS M0. Further, PMOSCTRL signal is equal to Pad voltage when Pad voltage is greater than the supply voltage. Consequently, the PMOS is switched off to avoid the transference of Pad voltage higher than supply voltage. PMOS M0 receives signal NWELL at its bias from the NWELL generation block. NWELL potential is equal to supply voltage when Pad voltage is less than the supply voltage and NWELL potential is VPAD−Vt (Threshold Voltage) when Pad voltage is higher than the supply voltage. When Pad voltage is higher than the supply voltage, there should not be any risk of consumption from Pad to bulk of transistor PMOS M0. Further, when Pad voltage is higher than the supply voltage, PMOS M0 is switched off and only NMOS M1 is operational. In this case VDD−Vtn (NMOS Threshold) appears as output voltage on VOUT, which is not the true supply voltage VDD and can thereby cause power consumption at the Input buffer. To overcome these constraints and get true value of supply voltage on VOUT, the drain of NMOS M24 is connected to VOUT, source is connected to the supply voltage and gate is connected to Pad, the Pad voltage being higher than the supply voltage. Whenever Pad voltage is greater than VDD+Vtn (NMOS Threshold), supply voltage is outputted at VOUT. Size of the transistor NMOS M24 is such that the voltage VOUT is equal to the supply voltage as soon as the PAD voltage crosses VDD.

Figure 4:
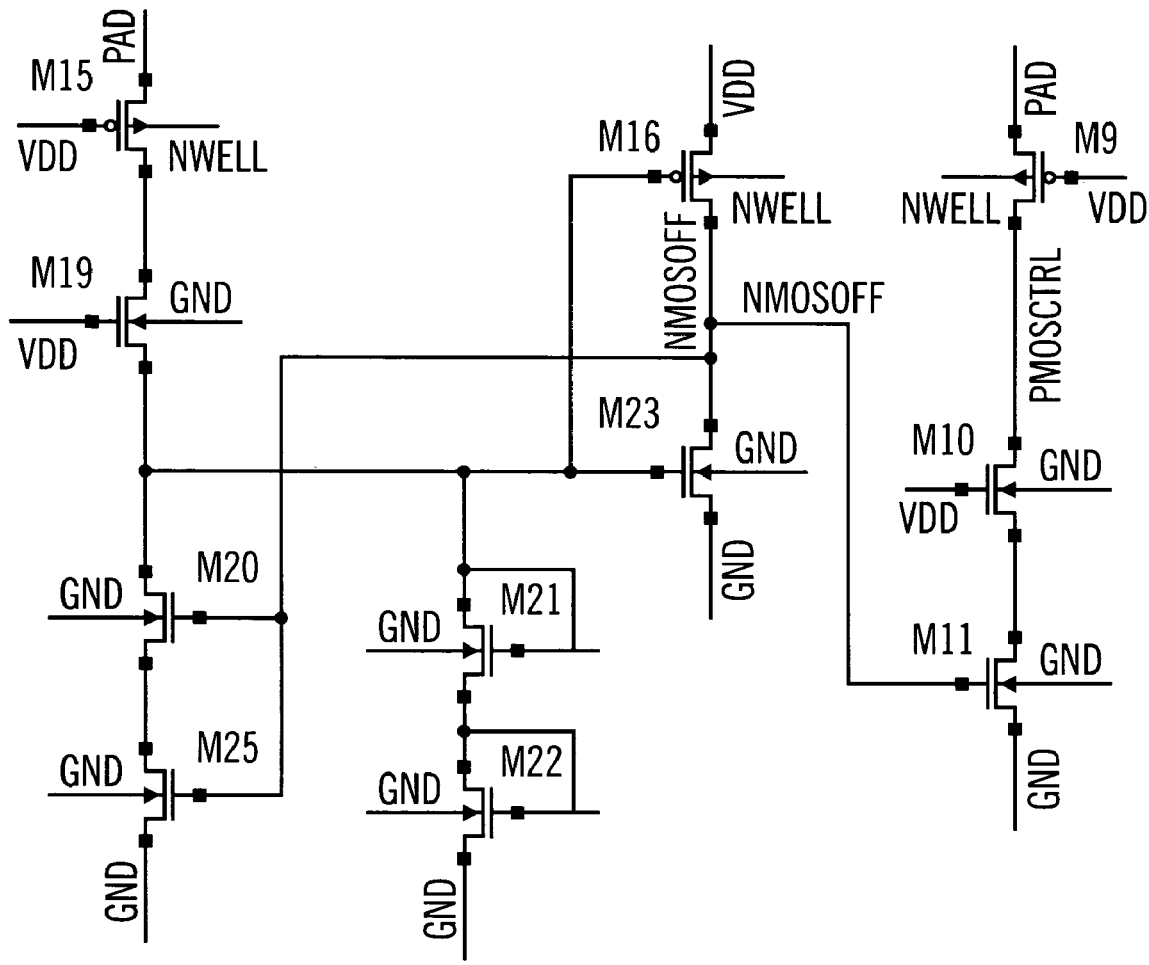
FIG. 4 is the circuit diagram of control signal generation of the voltage protection circuit of FIG. 2, in accordance an embodiment of the present invention.

FIG. 4 is a circuit level diagram of the Control Signal Generator of FIG. 2 that receives the input signal from Pad. PMOSCTRL signal is generated from this block as a result. The Control Signal Generator is required to operate for the following input/output parameters.

i. PMOSCTRL=0, when Pad voltage is less than or equal to VDD+Vt (PMOS Threshold).
ii. PMOSCTRL=Pad Voltage, when Pad voltage is higher than VDD+Vt (PMOS Threshold), here the PMOSCTRL signal follows the Pad voltage.

For obtaining the above stated parameters, the source terminal of PMOS M9 is connected to PAD, drain receives the PMOSCTRL signal, gate is connected to the supply voltage (VDD) and bias is connected to signal NWELL, to avoid power dissipation at the bulk of PMOS M9.

Drain of NMOS M10 is connected to PMOSCTRL, source of NMOS M10 is connected to the drain of NMOS M11 and gate of NMOS M10 is connected to VDD. As a result, stress on M10 and M11 is prevented when PMOSCTRL follows the Pad voltage, and zero volt signal is transferred when Pad voltage is less than VDD. Thus, the drain of M11 does not exceed NMOS Threshold and drain to source voltage of transistor M10 is VPad−VDD, so that the transistors are not stressed up to the Pad voltage.

Source of NMOS M11 is connected to ground GND, drain of NMOS M11 is connected to source of NMOS M10 and gate is connected to the signal NMOSOFF. The value of NMOSOFF signal is equal to supply voltage when Pad voltage is less than or equal to the supply voltage and it is equal to zero when Pad voltage is greater than the supply voltage.

As per the above description of M9, M11 and M11, the three transistors operate for the following input/output parameters:

i. When PAD voltage is less than or equal to VDD+Vt (PMOS Threshold), then the value of NMOSOFF is VDD so that NMOS M11 transfers zero volt to the source of M10. As gate of NMOS M10 is connected to VDD, it transfers zero volt to PMOSCTRL. As a result the gate to source voltage of PMOS M9 is positive, hence PMOS M9 is switched off, thereby outputting a zero potential at PMOSCTRL,
ii. When PAD voltage is greater than VDD+Vt (PMOS Threshold), a zero value of voltage is outputted at NMOSOFF, therefore the gate to source voltage of NMOS M11 is zero, thus resulting in a switched off NMOS M11. As a result the gate to source voltage of PMOS M9 is negative and the Pad voltage is transferred to PMOSCTRL, thus PMOSCTRL follows the Pad voltage.

It is desirable to have the value of NMOSOFF signal equal to VDD when Pad voltage is less than or equal to the supply voltage, and equal to zero when Pad voltage is greater than VDD.

To achieve the above stated objective, PMOS M15 & M16, NMOS M19, M20, M21, M22, M23 & M25 are used. Source of PMOS M15 is connected to PAD, gate of PMOS M15 is connected to VDD and drain of PMOS M15 is connected to drain of NMOS M19. PMOS M15 is on when pad voltage is greater than VDD+Vt (PMOS Threshold). Width of PMOS M15 should be kept high to transfer Pad voltage at the drain of PMOS M15 as soon as pad voltage crosses VDD.

Gate of NMOS M19 is connected to VDD, source of NMOS M19 is connected to the drain of NMOS M20, NMOS M21 and to the gate of PMOS M16 and NMOS M23. NMOS M19 is used to avoid any stress on MOS M16, M20, M21, M22, M23 & M25. In any case source of NMOS M19 does not exceed VDD−Vt (NMOS Threshold).

NMOS M20 and M25 are connected in series. Drain of NMOS M20 is connected to source of M19, source of NMOS M25 is connected to ground GND and gates of both NMOS M20 & M25 are connected to signal NMOSOFF. NMOS M20 & M25 should be long channel transistors for good switching at the drain of NMOS M20. When Pad voltage is higher than VDD, gates of M16 & M23 should be close to VDD−Vt (NMOS Threshold), thus the current through these M20 and M25 should be very less.

Drain of NMOS M21 and M22 are connected to their gate, wherein both the transistors operate like diodes. Source of NMOS M21 is connected to drain of NMOS M22, source of NMOS M22 is connected to ground GND. NMOS M21 and M22 are used to provide 2*Vt (NMOS Threshold) to the gate of M16 and M23, when Pad voltage is less than or equal to VDD. NMOS M21 & M22 are long channel transistors for reducing power dissipation on Pad, the Pad voltage being greater than VDD.

PMOS M16 and NMOS M23 are connected together to form an inverter. Switching threshold for this inverter should be greater than 2*Vt (NMOS Threshold) and less than VDD−Vt (NMOS Threshold) for obtaining the desired value of NMOSOFF.

As per the above description of M15, M16, M20, M21, M22, M23 & M25, the circuit operates for the following input/output parameters.

When Pad voltage is less than or equal to VDD+Vt (PMOS Threshold), Vgs (Gate to source voltage) of PMOS M15 is positive, consequently M15 is switched off. A potential 2*Vt (NMOS Threshold) is established at the gate of M16 and M23, due to NMOS M21 & M22. The switching threshold of the inverter formed by M16 and M23 causes NMOSOFF approach towards VDD, thereby causing NMOS M20 & M25 to be switched on, thus the potential at the gates of M16 and M23 is zero volts. Thereby, NMOSOFF approaches true value of VDD.

When PAD voltage is greater than VDD+Vt (PMOS Threshold). Vgs of PMOS M15 is negative so the PMOS M15 is switched on. As gate of NMOS M19 is connected to VDD, gate of M16 & M23 achieve a voltage level of VDD−Vt (NMOS Threshold). As a result of the switching threshold of the inverter formed by M16 and M23, NMOSOFF become ZERO and NMOS M20 & M25 are switched off.

Figure 5:
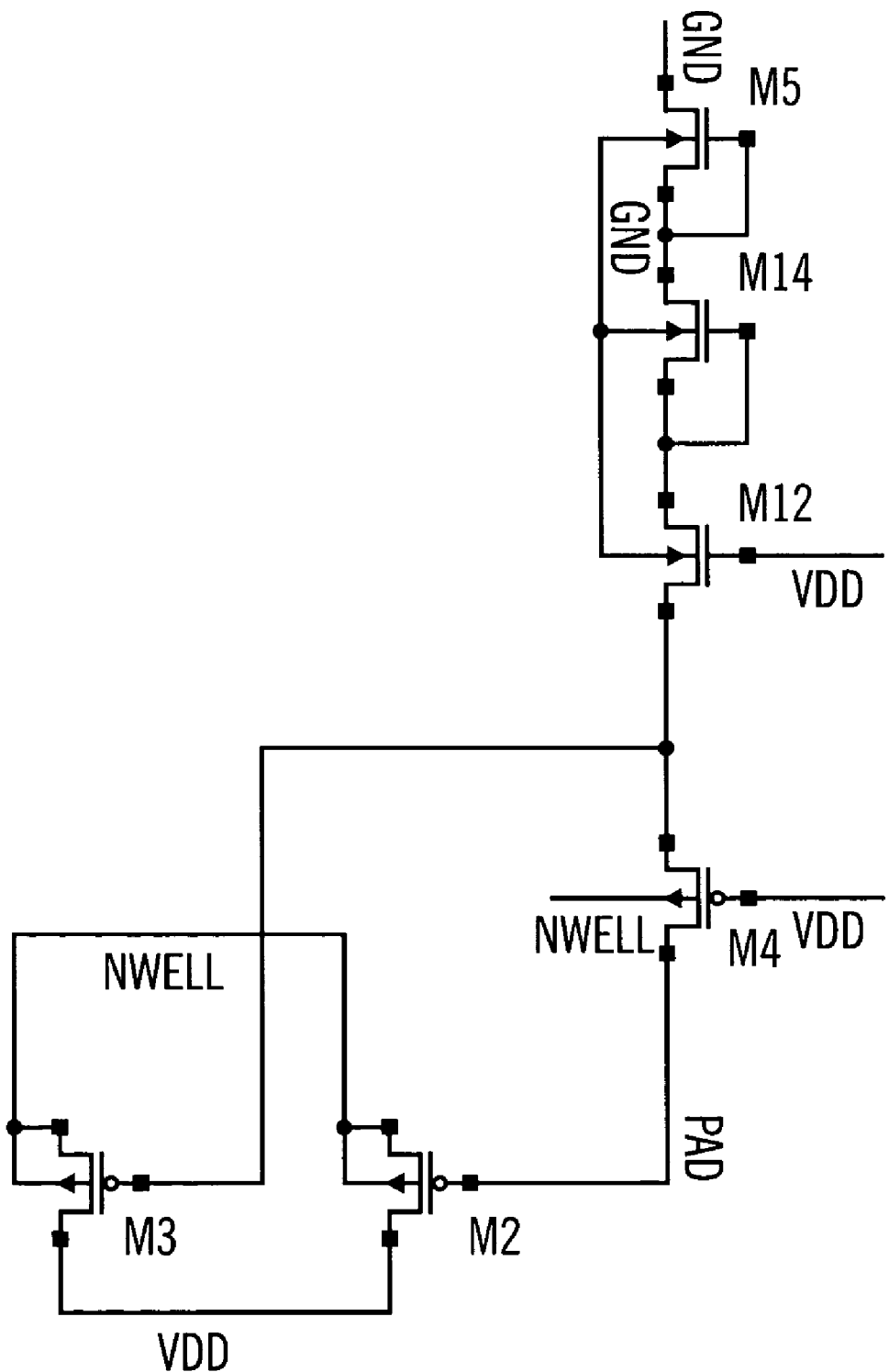
FIG. 5 is the circuit diagram of a conventional NWELL (bias for PMOS transistors) generation block of the voltage protection circuit of FIG. 2, in accordance with an embodiment of the present invention.

FIG. 5 illustrates the circuit diagram of a conventional NWELL generator. PAD is the input signal for the NWELL generator and it generates bias signals for PMOS transistors in the protection circuit.

As described earlier, bias voltage for each PMOS transistors in the protection circuit is desirable at VDD when Pad voltage is less than VDD and at VPAD−Vt (Threshold voltage) when Pad voltage is greater than VDD.

To achieve this, the source of PMOS M2 is connected to VDD, drain & bulk of PMOS M2 is connected to NWELL, and gate of PMOS M2 is connected to PAD. Source of PMOS M4 is connected to PAD, gate of PMOS M4 is connected to VDD, bulk of PMOS M4 is connected to NWELL and drain of PMOS M4 is connected to gate of PMOS M3 and to the drain of NMOS M12. Source of PMOS M3 is connected to VDD, drain & bulk of PMOS M3 is connected to NWELL. Gate of NMOS M12 is connected to VDD, source is connected to drain and gate of NMOS M14. This NMOS is used to avoid stress on M14 and M5. NMOS M14 and M5 are drain-gate connected transistors for providing 2*Vt (NMOS Threshold) on the gate of PMOS M3 when Pad voltage is less than VDD+Vt (PMOS Threshold).

As per the above stated description, the transistors M2, M3, M4, M5, M12 & M14, operate to perform the following functions:

When Pad voltage is less than or equal to VDD+Vt (PMOS Threshold), Vgs of PMOS M4 is greater than PMOS threshold, thus PMOS M4 is switched off. Due to drain gate configuration of NMOS M14 and M5, gate of M3 is at 2*Vt (NMOS Threshold). As a result the gate voltage (Vg) of PMOS M3 is less than the threshold voltage, hence VDD is outputted at NWELL. For Pad voltage range 0 to VDD−Vt (PMOS Threshold) PMOS M2 is switched on.

When Pad voltage is greater than VDD+Vt (PMOS Threshold), Vgs of PMOS M4 is less than PMOS threshold, thus PMOS M4 is switched on and gate of PMOS M3 and M2 are at same potential as on PAD, thereby resulting in switching off PMOS M2 and M3. As source of PMOS M4 is connected to PAD and bulk is connected to NWELL, there is one diode formed between source and bulk. If source voltage is higher the bulk voltage plus threshold voltage, diode conducts and NWELL become VPAD−Vt (Threshold voltage).

Figure 6:
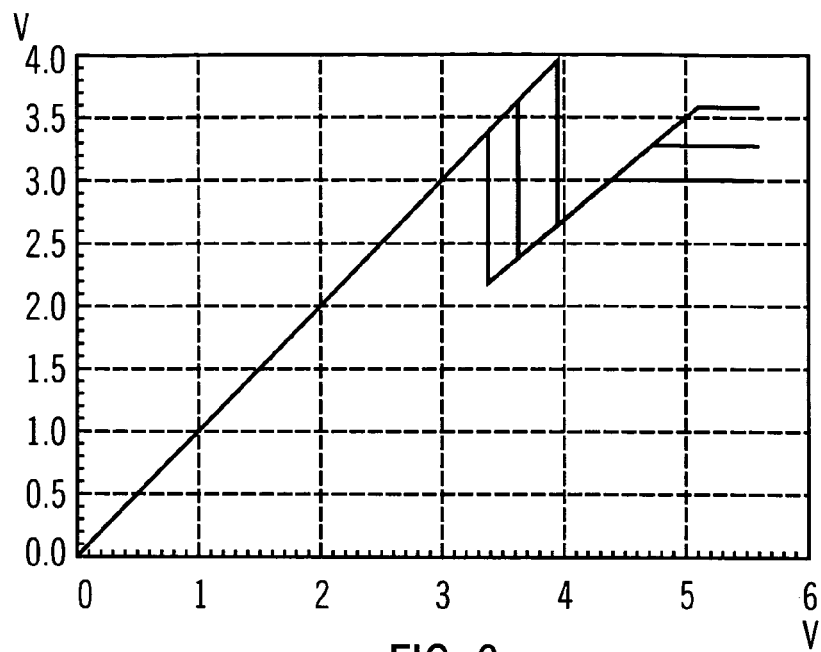
FIG. 6 is the graph of the DC sweep of the protection circuit in accordance an embodiment of the present invention.

FIG. 6 shows the effect of using protection circuit for the Input buffer in dc-sweep. Here, X-Axis of this graph is the PAD voltage while the Y-Axis is the voltage to the Input Buffer. The protection circuit is simulated for three supply voltage levels 3.0V, 3.3V and 3.6V. As shown in the figure, the PAD voltage is varied from 0V to 5.6 Volt. VOUT follows the PAD voltage up to VDD+Vt (PMOS Threshold, ~0.35V in this simulation), and the value of VOUT is either VDD−Vt (NMOS threshold) or VDD. Simulation results show that the Input buffer is protected from the higher PAD voltage and there can be full swing from 0V to supply voltage (VDD) at VOUT. Thus, it is concluded from the simulation results that attenuation free signal is obtained for the Input buffer.

Figure 7:
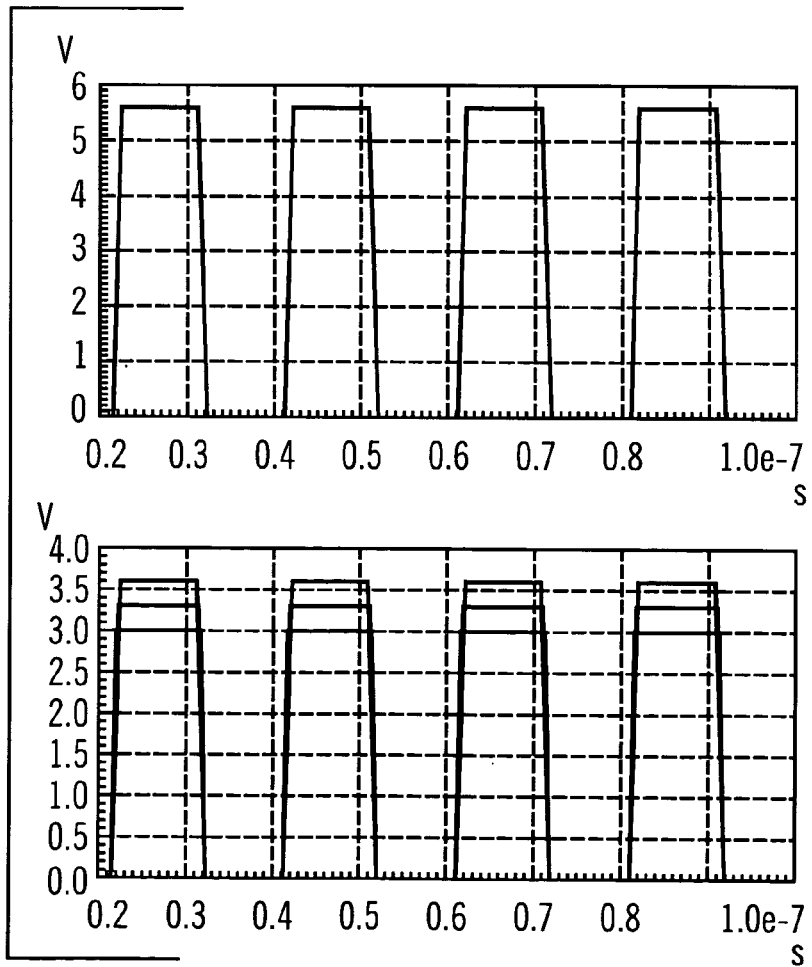
FIG. 7 is the graph of the transient simulation of the circuit in accordance an embodiment of the present invention.

FIG. 7 shows the transient simulation results. Here, the circuit is simulated for the supply voltage levels of 3.0V, 3.3V and 3.6V. Pulse of amplitude 5.6V is applied on the PAD for generating a pulse of amplitude equal to supply voltage (VDD) at VOUT, thus providing the required voltage level to the Input Buffer.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A voltage tolerant protection circuit for an input buffer, the circuit comprising:

a transmission gate circuit for receiving an input signal from an input pad;

a N-Well generation circuit electrically coupled between the input pad and the transmission gate circuit;

a control signal generator electrically coupled between the transmission gate circuit and the input pad to provide a control signal for operating the transmission gate circuit, wherein the control signal generator comprising:

a first PMOS transistor electrically coupled to the input pad, the first PMOS transistor receiving control signals from a supply voltage and the N-Well generator block for avoiding consumption on the input pad;

a second NMOS transistor electrically coupled to the first PMOS transistor, the second PMOS transistor receiving control signals from the supply voltage and a ground voltage for receiving a voltage potential when the voltage on the input pad voltage is less than the supply voltage;

a third NMOS transistor electrically coupled to the second NMOS transistor, the third NMOS receiving control signals for transferring a voltage potential to a source of the second NMOS transistor when the voltage on the input pad is less than or equal to PMOS threshold and to form a open circuit path when the voltage on the input pad is greater than PMOS threshold;

a fourth PMOS transistor electrically coupled to the input pad, the fourth PMOS transistor receiving a bias signal and the supply voltage for providing a closed path for conduction when pad voltage is greater than the PMOS threshold;

a fifth NMOS transistor electrically coupled to the fourth PMOS transistor, the fifth NMOS transistor for receiving control signals from the supply voltage and the ground voltage to provide a controlled voltage response when the voltage on the pad voltage is greater than supply voltage;

a sixth NMOS transistor electrically coupled to the fifth NMOS transistor, the sixth PMOS transistor for providing a controlled potential at a source of the fifth NMOS transistor;

a seventh NMOS transistor electrically coupled to the sixth NMOS transistor for providing a controlled closed circuit path;

an eighth NMOS transistor and a ninth NMOS transistor electrically coupled to the sixth NMOS transistor for outputting a NMOS threshold voltage potential when the voltage on the pad is less than or equal to the supply voltage; and a ninth PMOS transistor and an tenth NMOS transistor electrically coupled to the sixth NMOS transistors, to the seventh NMOS transistors, and to the eighth NMOS transistor for providing the supply voltage, without any change in amplitude, to the third NMOS transistor;

wherein the N-Well generation is electrically coupled to the control signal generator for generating the bias signal for the transmission gate circuit and the control signal generator.

2. The voltage tolerant protection circuit as claimed in claim 1, wherein the transmission gate circuit further comprises:
   a first transistor receiving the control signal from the control signal generator and the bias signal from the N-Well generation circuit to transfer voltage on the input pad from a threshold voltage to a supply voltage;
   a second transistor electrically coupled to the first transistor, the second transistor receiving the supply voltage and a ground voltage which provides control signals to form a closed path when pad voltage is higher than the supply voltage; and
   a third transistor electrically coupled to the first and second transistors for providing an output equal to the supply voltage when a voltage on the input pad voltage exceeds the supply voltage.

3. The voltage tolerant protection circuit as claimed in claim 2, wherein the first transistor is a PMOS transistor and the second and third transistors are NMOS transistors.

4. The voltage tolerant protection circuit as claimed in claim 1, wherein the sixth and seventh NMOS transitors are electrically coupled in series.

5. The voltage tolerant protection circuit as claimed in claim 1, wherein a drain terminal of the eighth and ninth NMOS transistors are electrically coupled to their respective gate terminals, and a source of the eighth NMOS transistor is electrically coupled to a drain of the ninth NMOS transistor.

6. The voltage tolerant protection circuit as claimed in claim 1, wherein the ninth PMOS transistor and the tenth NMOS transistor are electrically coupled to each other to form an inverter circuit.

7. A voltage tolerant protection circuit for an input buffer, the circuit comprising:
   a transmission gate circuit for receiving an input signal from an input pad;
   a N-Well generation circuit electrically coupled between the input pad and the transmission gate circuit;
   a control signal generator electrically coupled between the transmission gate circuit and the input pad to provide a control signal for generating the transmission gate circuit, wherein the control signal generator comprising:
      a first transistor electrically coupled to the input pad, the first transistor receiving control signals from a supply voltage and the N-Well generator block for avoiding consumption on the input pad; and
      a second transistor electrically coupled to the first transistor, the second transistor receiving control signals from the supply voltage and a ground voltage for transferring a voltage potential when the voltage on the input pad voltage is less than the supply voltage;
   wherein the N-Well generation is electrically coupled to the control signal generator for generating the bias signal for the transmission gate circuit and the control signal generator.

8. The voltage tolerant protection circuit as claimed in claim 7, wherein the transmission gate circuit further comprises:
   a first transistor receiving control signals from the control signal generator and the bias signal from the N-Well generation circuit to transfer voltage on the input pad form a threshold voltage to a supply voltage; and
   a second transistor electrically coupled to the first transistor, the second transistor receiving the supply voltage and a ground voltage which provides control signals to form a closed path when pad voltage is higher than the supply voltage.

9. The voltage tolerant protection circuit as claimed in claim 8, wherein the control signal generator further comprises:
   a third transistor electrically coupled to the first and second transistor for providing an output equal to the supply voltage when a voltage on the input pad voltage exceeds the supply voltage.

10. The voltage tolerant protection circuit as claims in claim 9, wherein the control signal generator further comprises:
    a fourth transistor electrically coupled to the input pad, the fourth transistor receiving the bias signal and the supply voltage for providing a closed path for conduction when pad voltage is greater than a threshold of the fourth transistor.

11. The voltage tolerant protection circuit as claims in claim 10, wherein the control signal generator further comprises:
    a fifth transistor electrically coupled to the fourth transistor, the fifth transistor for receiving control signals from the supply voltage and the ground voltage to provide a controlled voltage response when the voltage on the pad voltage is greater than supply voltage.

12. The voltage tolerant protection circuit as claims in claim 11, wherein the control signal generator further comprises:
    a sixth transistor electrically coupled to the fifth transistor, the six transistor for providing a controlled potential at a source of the fifth transistor.

13. The voltage tolerant protection circuit as claims in claim 12, wherein the control signal generator further comprises:
    a seventh transistor electrically coupled to the sixth transistor for providing a controlled closed circuit path.

14. The voltage tolerant protection circuit as claims in claim 13, wherein the control signal generator further comprises:
    an eighth transistor and a ninth transistor electrically coupled to the sixth transistor for outputting a threshold voltage potential when the voltage on the pad is less than or equal to the supply voltage.

15. The voltage tolerant protection circuit as claims in claim 14, wherein the control signal generator further comprises:
    a ninth transistor and an tenth transistor electrically coupled to the sixth transistors, to the seventh transistors, and to the eighth transistor for providing the supply voltage, without any change in amplitude, to the third transistor.

* * * * *

UNITED STATES PATENT AND TRADEMARK OFFICE
CERTIFICATE OF CORRECTION

PATENT NO.        : 7,239,176 B2                                            Page 1 of 1
APPLICATION NO. : 11/143094
DATED             : July 3, 2007
INVENTOR(S)       : Nitin Gupta It is certified that error appears in the above-identified patent and that said Letters Patent is hereby corrected as shown below:

Please make the following changes:

Column 8, line 21 & 22, from "generator" to -- generations--
Column 10, line 4, from "form" to -- from --
Column 10, line 14, from "transistor" to -- transistors --

Signed and Sealed this

Seventh Day of August, 2007

JON W. DUDAS
*Director of the United States Patent and Trademark Office*